United States Patent [19]
Shimizu

[11] Patent Number: 6,013,941
[45] Date of Patent: Jan. 11, 2000

[54] BIPOLAR TRANSISTOR WITH COLLECTOR SURGE VOLTAGE PROTECTION

[75] Inventor: Takayuki Shimizu, Minato-ku, Japan

[73] Assignee: Oki Electric Industry Co., Ltd., Tokyo, Japan

[21] Appl. No.: 08/942,304

[22] Filed: Oct. 1, 1997

[30] Foreign Application Priority Data

Mar. 21, 1997 [JP] Japan .................................. 9-068242

[51] Int. Cl.$^7$ .................................................. H01L 29/54
[52] U.S. Cl. .......................... 257/565; 257/575; 257/577; 257/580; 257/582; 257/583; 257/173; 257/176; 257/355; 257/361; 257/362; 257/363; 257/565
[58] Field of Search .................................. 257/575, 576, 257/577–579, 587, 580, 588, 581–582, 172–176, 355, 361, 362, 363

[56] References Cited

U.S. PATENT DOCUMENTS

| | | | |
|---|---|---|---|
| 4,604,640 | 8/1986 | Colman et al. ........................ | 257/572 |
| 4,827,322 | 5/1989 | Takata ..................................... | 257/572 |
| 4,868,624 | 9/1989 | Grung et al. ........................... | 257/577 |
| 4,967,243 | 10/1990 | Baliga et al. ........................... | 257/172 |
| 4,982,244 | 1/1991 | Kapoor ................................... | 257/577 |
| 5,481,132 | 1/1996 | Moreau .................................. | 257/588 |

FOREIGN PATENT DOCUMENTS

| | | | |
|---|---|---|---|
| 000117566 | 9/1984 | European Pat. Off. ............... | 257/577 |
| 7-122715 | 5/1995 | Japan . | |

*Primary Examiner*—Fetsum Abraham
*Attorney, Agent, or Firm*—Jones Volentine, L.L.P.

[57] ABSTRACT

A semiconductor device provided with a planar bipolar transistor and a built-in ingredient acting as an element to protect the bipolar transistor from an external surge voltage e.g. an electrostatic surge voltage and the like, is provided with a planar bipolar transistor further provided with a doped region having a conductivity opposite to that of a semiconductor substrate in which the foregoing planar bipolar transistor is produced, the doped region being produced along the top surface of the semiconductor substrate at a location close to the bipolar transistor, and the emitter of the bipolar transistor being connected the doped region and a fixed potential ($V_{EE}$) or the ground potential, whereby the operation speed of a circuit including the transistor is not reduced by potential parasitic capacitors which otherwise accompany the built-in ingredients produced to protect the transistor from an external surge voltage e.g. an electrostatic surge voltage and the like.

17 Claims, 18 Drawing Sheets

F I G. 11
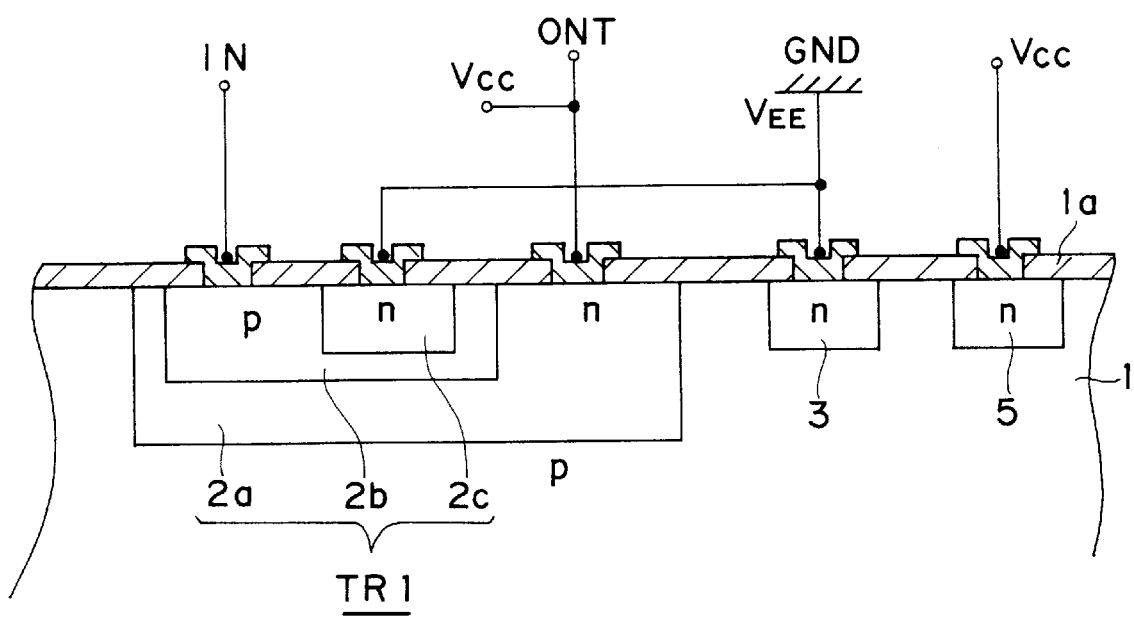

F I G. 1 2
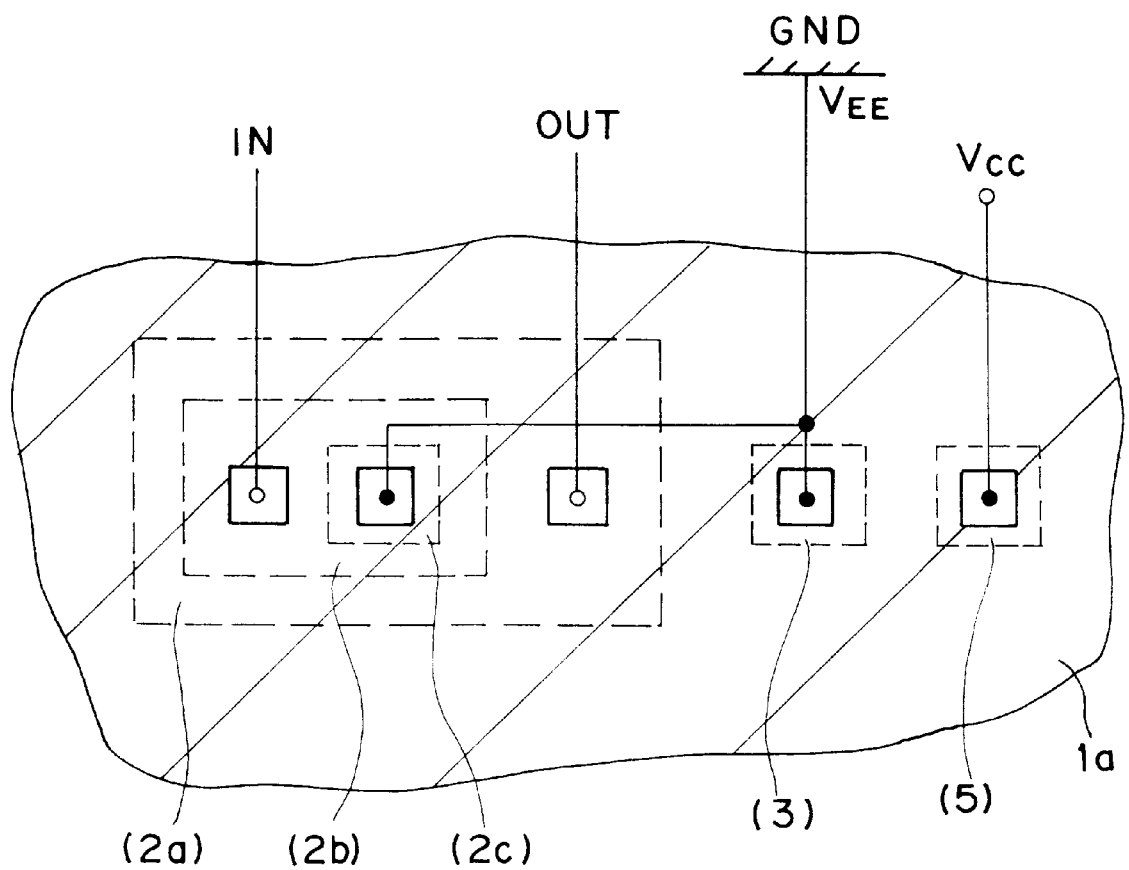

F I G. 1 3
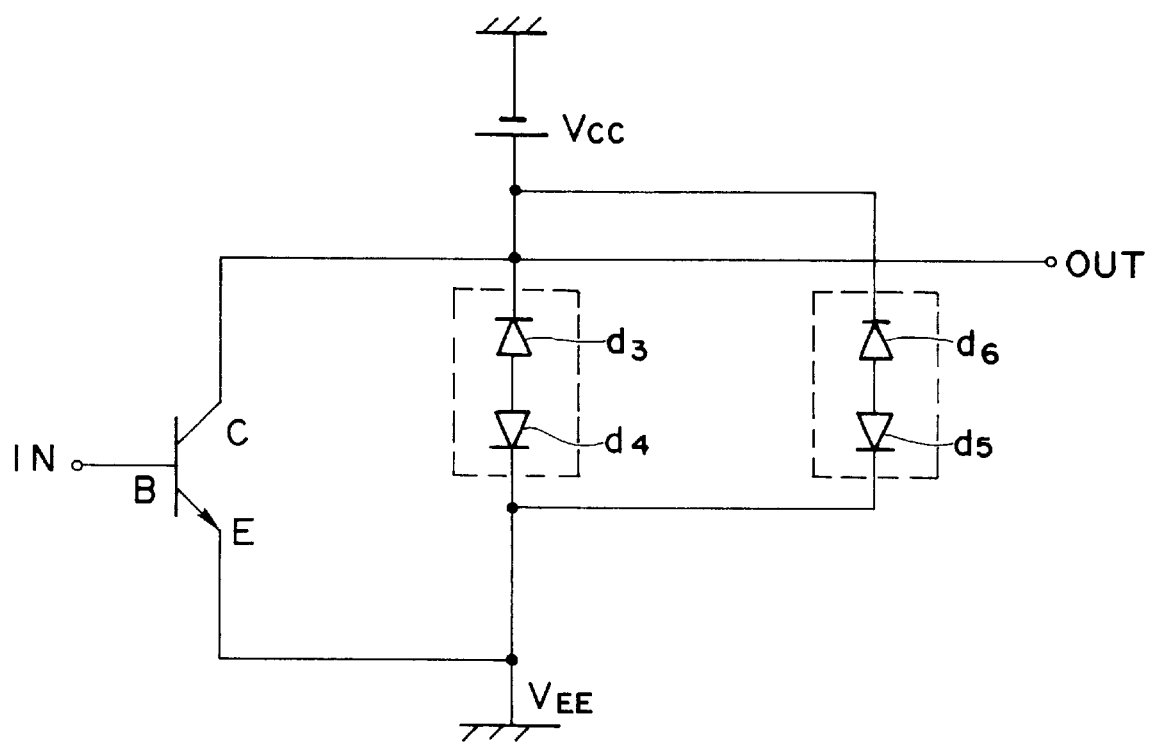

F I G. 1 5
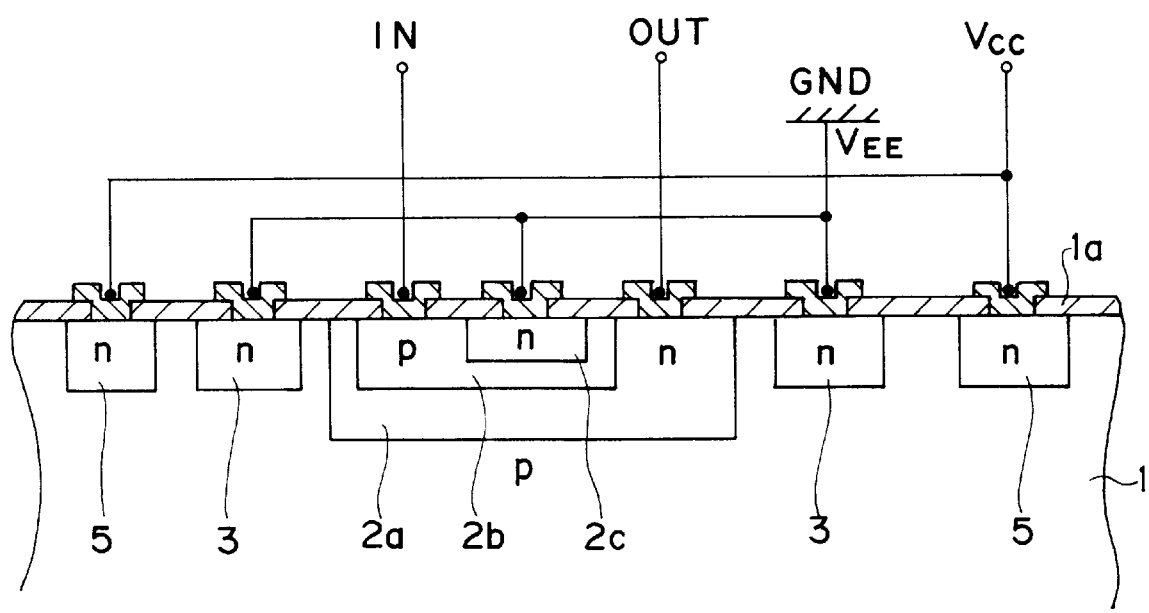

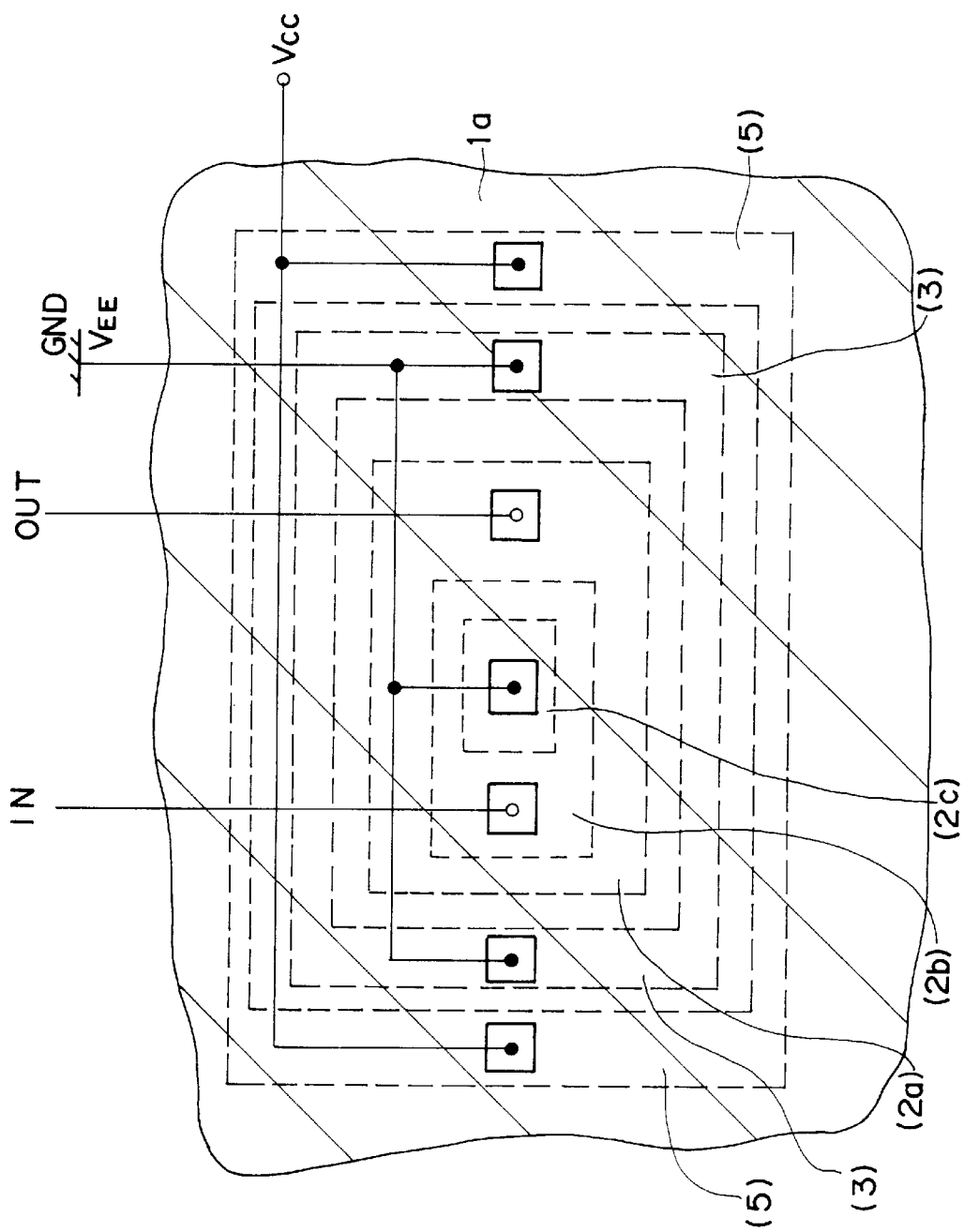

BIPOLAR TRANSISTOR WITH COLLECTOR SURGE VOLTAGE PROTECTION

FIELD OF THE INVENTION

This invention relates to a semiconductor device provided with a planar bipolar transistor and a built-in ingredient acting as an element to protect the bipolar transistor from an external surge voltage e.g. an electrostatic surge voltage and the like.

BACKGROUND OF THE INVENTION AND PRIOR ART STATEMENT

A transistor is often exposed to an external surge voltage e.g. an electrostatic surge voltage which is often generated in an IC or the like in which the transistor is employed, during a period in which the IC or the like is employed under environments where the IC or the like is rubbed with an insulator, resultantly electrostatic electricity is generated in and/or on the IC or the like. To protect the transistor from such an external surge voltage, an ingredient acting as an element to drive away the external voltage from the transistor or to cause the external voltage to bypass the transistor, is built in a semiconductor device in which the transistor is built as well.

A brief description of an example of such a semiconductor device provided with a planar bipolar transistor and a built-in ingredient acting as an element to protect the bipolar transistor from an external surge voltage e.g. an electrostatic surge voltage and the like will be presented below, referring to drawings, including FIG. 1 which illustrates a circuit thereof and FIG. 2 which illustrates a schematic layer configuration thereof.

Referring to FIG. 1, an input signal (IN) is applied to the base (B) of an NPN transistor (TR1), and the output signal (OUT) is taken out of the collector (C) of the transistor (TR1). A positive power supply ($V_{CC}$) is applied to the collector (C) through a diode ($d_1$) connected in a backward direction to the positive power supply ($V_{CC}$). The collector (C) is grounded or is connected a fixed potential ($V_{EE}$) or the ground potential through a diode ($d_2$) bridging the collector (C) and the fixed potential ($V_{EE}$) in a backward direction. In other words, the diode ($d_2$) is connected to bridge the collector (C) and the fixed potential ($V_{EE}$) or the ground potential in a direction toward the collector (C) from the fixed potential ($V_{EE}$) the ground potential. The emitter (E) of the transistor (TR1) is grounded or is connected a fixed potential ($V_{EE}$) or the ground potential, as well. In this circuit, a combination of two diodes ($d_1$) and ($d_2$) is a built-in ingredient (100) acting as an element to protect the transistor (TR1) from an external surge voltage. In the drawing, the built-in ingredient (100) is surrounded by a box shown in a broken line.

Referring to FIG. 2, the NPN transistor (TR1) consisting of a collector (2a), a base (2b) and an emitter (2c) is produced in a p-doped semiconductor substrate (1). In the neighborhood of the transistor (TR1), the diode ($d_1$) consisting of a p-doped layer (101b) produced in an n-doped layer (101a) produced in the p-doped semiconductor substrate (1) and the diode ($d_2$) consisting of a p-doped layer (102b) produced in an n-doped layer (102a) produced in the p-doped semiconductor substrate (1) are provided. The collector (2a) is connected the p-doped layer (101b) of the diode ($d_1$) of which the n-doped layer (101a) is connected the positive power supply ($V_{CC}$). The collector (2a) is also connected the n-doped layer (102a) of the diode ($d_2$). The output signal (OUT) is taken out of the collector (2a). The input signal (IN) is applied to the base (2b). The emitter (2c) and the p-doped layer (102b) of the diode ($d_2$) are grounded or connected the fixed potential ($V_{EE}$).

An external positive surge voltage in excess of the power supply voltage ($V_{CC}$) applied to the collector (C) causes the diode ($d_1$) to turn on, resultantly being driven away toward the power supply ($V_{CC}$) not to raid the transistor (TR1). An external negative surge voltage below the fixed potential ($V_{EE}$) applied to the collector (C) causes the diode ($d_2$) to turn on, resultantly being driven away toward the fixed potential ($V_{EE}$) not to raid the transistor (TR1). In this manner, the transistor (TR1) is protected from an external surge voltage, regardless of the polarity thereof.

A piece of patent information, JP-A-95-122715, discloses a semiconductor device provided with a planar bipolar transistor attached by a monolithic ingredient acting as a parasitic bipolar transistor for protecting the bipolar transistor from an external surge voltage.

The foregoing semiconductor device provided with a bipolar transistor attached by a monolithic or built-in ingredient acting as a parasitic bipolar transistor for protecting the bipolar transistor from an external surge voltage is, however, involved with a drawback in which one or more parasitic capacitors is or are inevitably formed to be connected with the bipolar transistor. These parasitic capacitors readily decrease the operation speed of the circuit including the bipolar transistor. For example, referring to FIGS. 1 and 2, the operation speed of the transistor (TR1) is reduced by three potential parasitic capacitors including the one consisting of the wirings connecting the collector (2a) of the transistor (TR1) and the diodes ($d_1$) and ($d_2$), an insulator layer (1a) covering the top surface of the p-doped semiconductor substrate (1) and the p-doped semiconductor substrate (1), and the other two caused by depletion layers separating the p-doped layers and the n-doped layers of the diodes ($d_1$) and ($d_2$).

OBJECTS AND SUMMARY OF THE INVENTION

Accordingly, an object of this invention is to provide a semiconductor device provided with a planar bipolar transistor and a built-in ingredient acting as an element to protect the bipolar transistor from an external surge voltage e.g. an electrostatic surge voltage and the like, wherein the operation speed of a circuit including the transistor is not reduced by potential parasitic capacitors which otherwise accompany the built-in ingredients produced to protect the transistor from an external surge voltage e.g. an electrostatic surge voltage and the like.

To achieve the foregoing object, a semiconductor device provided with a planar bipolar transistor and a built-in ingredient acting as an element to protect the bipolar transistor from an external surge voltage e.g. an electrostatic surge voltage and the like, in accordance with a first embodiment of this invention, is provided with a planar bipolar transistor further provided with a doped region having a conductivity opposite to that of a semiconductor substrate in which the foregoing planar bipolar transistor is produced, the doped region being produced along the top surface of the semiconductor substrate at a location close to the bipolar transistor, and the emitter of the bipolar transistor being connected with the doped region and a fixed potential ($V_{EE}$) or the ground potential.

In the foregoing semiconductor device, the planar bipolar transistor can be either an NPN transistor or a PNP transistor.

In the foregoing semiconductor device, the semiconductor substrate can be connected the fixed potential ($V_{EE}$) or the ground potential as well.

In the foregoing semiconductor device, the bipolar transistor can be surrounded by the foregoing doped region.

In the foregoing semiconductor device, an other doped region which is connected a positive power supply ($V_{CC}$), can be provided at a location close to the foregoing doped region.

In the foregoing semiconductor device provided with two independent doped regions, the planar bipolar transistor can be either an NPN transistor or a PNP transistor.

In the foregoing semiconductor device provided with two independent doped regions, the semiconductor substrate can be connected the fixed potential ($V_{EE}$) or the ground potential as well.

In the foregoing semiconductor device provided with two independent doped regions, the bipolar transistor can be surrounded by the foregoing first doped region and by the foregoing other doped region.

In the foregoing semiconductor device provided with two independent doped regions, a half part of the bipolar transistor can be surrounded by the foregoing doped region and the remaining half part of the bipolar transistor can be surrounded by the foregoing other doped region.

In the foregoing semiconductor device provided with two independent doped regions, most the bipolar transistor can be surrounded by the foregoing doped region, leaving a limited part of the bipolar transistor to be attached by the foregoing other doped region.

BRIEF DESCRIPTION OF THE DRAWINGS

This invention, together with its various features and advantages, can be readily understood from the following more detailed description presented in conjunction with the following drawings, in which:

FIG. 11 is a schematic cross section of a semiconductor device provided with a planar bipolar transistor and a built-in ingredient acting as an element to protect the bipolar transistor from an external surge voltage e.g. an electrostatic surge voltage and the like, in accordance with a third embodiment of this invention, FIG. 12 is a schematic plan view of a semiconductor device provided with a planar bipolar transistor and a built-in ingredient acting as an element to protect the bipolar transistor from an external surge voltage e.g. an electrostatic surge voltage and the like, in accordance with a third embodiment of this invention, FIG. 13 is an equivalent circuit of a semiconductor device provided with a planar bipolar transistor and a built-in ingredient acting as an element to protect the bipolar transistor from an external surge voltage e.g. an electrostatic surge voltage and the like, in accordance with a third embodiment of this invention, FIG. 15 is schematic cross section of a semiconductor device provided with a planar bipolar transistor and a built-in ingredient acting as an element to protect the bipolar transistor from an external surge voltage e.g. an electrostatic surge voltage and the like, in accordance with a fourth embodiment of this invention, FIG. 16 is a schematic plan view of a semiconductor device provided with a planar bipolar transistor and a built-in ingredient acting as an element to protect the bipolar transistor from an external surge voltage e.g. an electrostatic surge voltage and the like, in accordance with a fourth embodiment of this invention.

DETAILED DESCRIPTION OF THE PREFERRED EMBODIMENTS OF THIS INVENTION

Referring to drawings, a detailed description will be presented below for semiconductor devices each of which is provided with a planar bipolar transistor and a built-in ingredient acting as an element to protect the bipolar transistor from an external surge voltage e.g. an electrostatic surge voltage and the like, in accordance with four independent embodiments of this invention.

First Embodiment

A planar bipolar transistor having a doped region having a conductivity opposite to that of a semiconductor substrate, the doped region being produced along the top surface of the semiconductor substrate at a location close to the bipolar transistor, and the emitter of the bipolar transistor being connected the doped region and a fixed potential ($V_{EE}$) or the ground potential.

Figure 1:
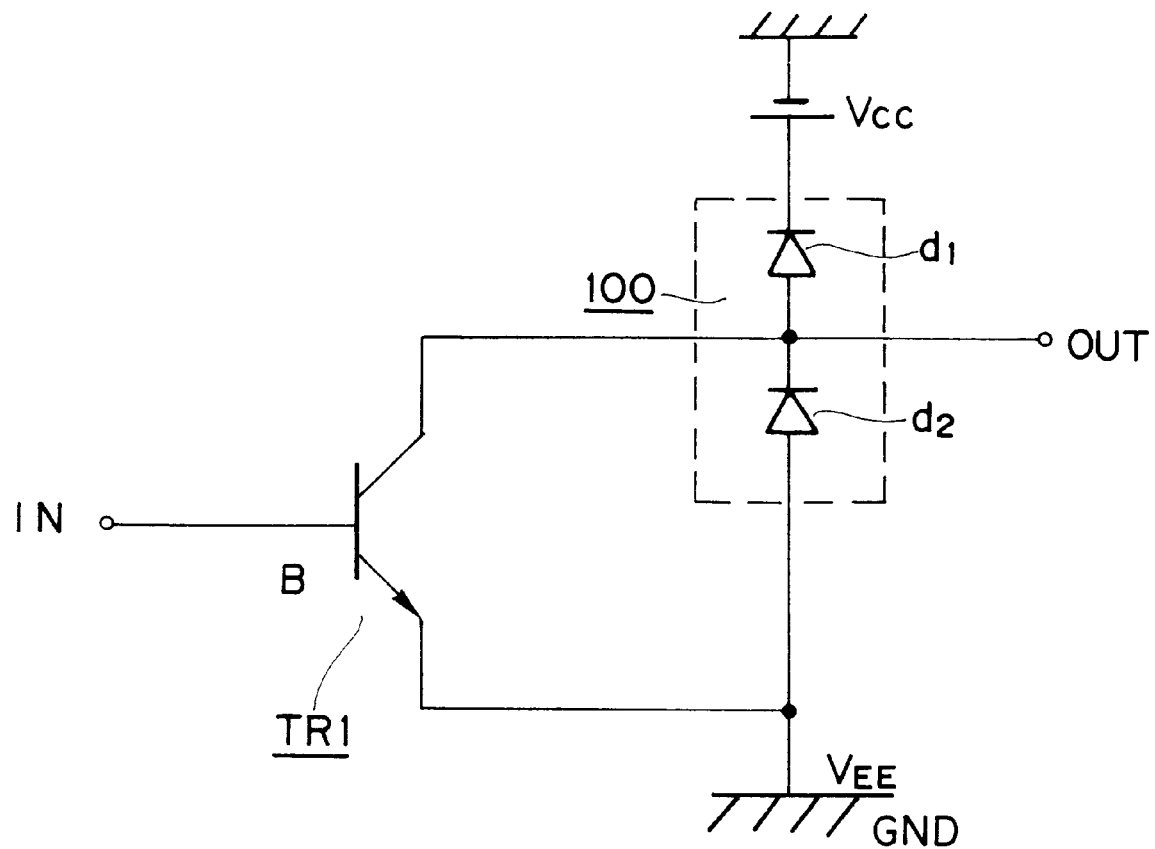
FIG. 1 is a circuit of an exemplary semiconductor device provided with a planar bipolar transistor and a built-in ingredient acting as an element to protect the bipolar transistor from an external surge voltage e.g. an electrostatic surge voltage and the like, available in the prior art.
Figure 2:
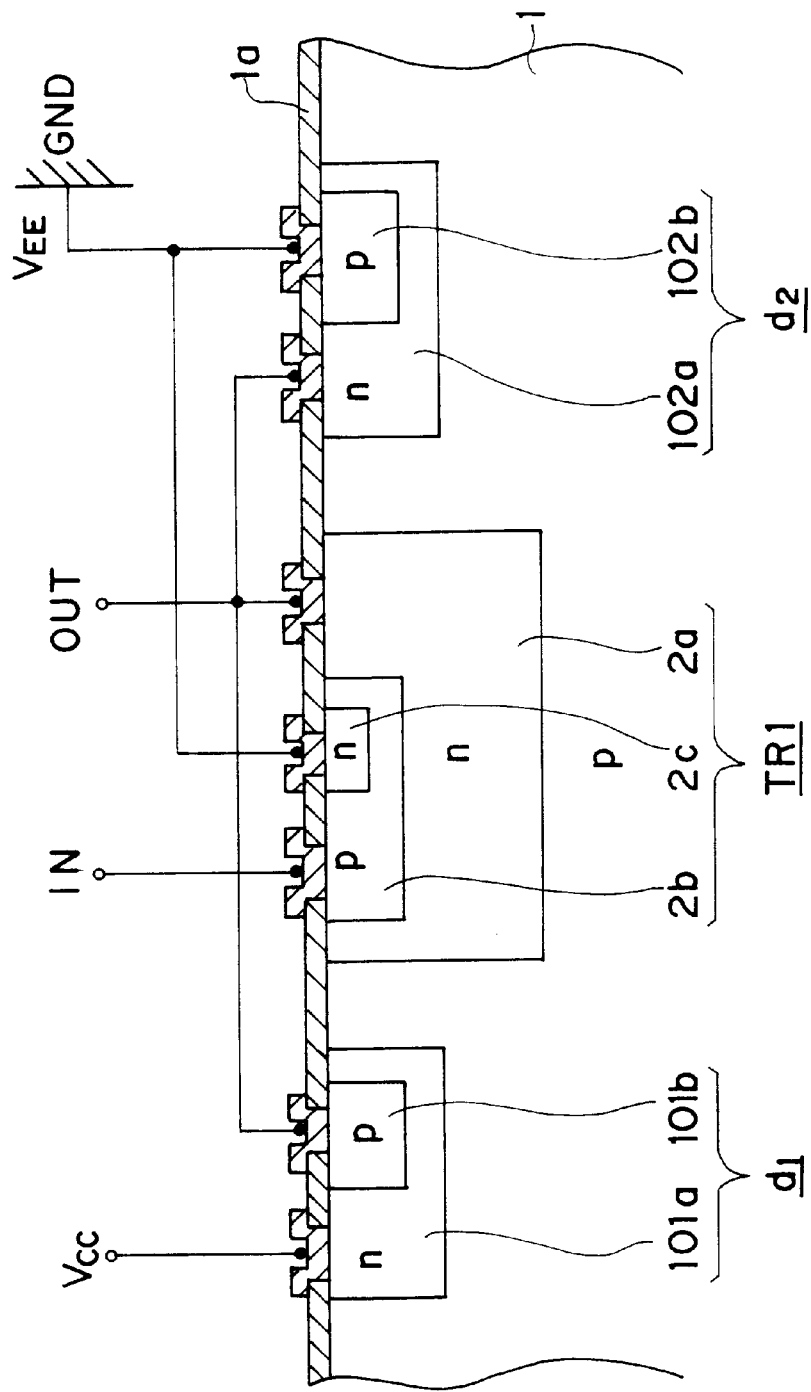
FIG. 2 is a schematic cross section of an exemplary semiconductor device provided with a planar bipolar transistor and a built-in ingredient acting as an element to protect the bipolar transistor from an external surge voltage e.g. an electrostatic surge voltage and the like, available in the prior art.
Figure 3:
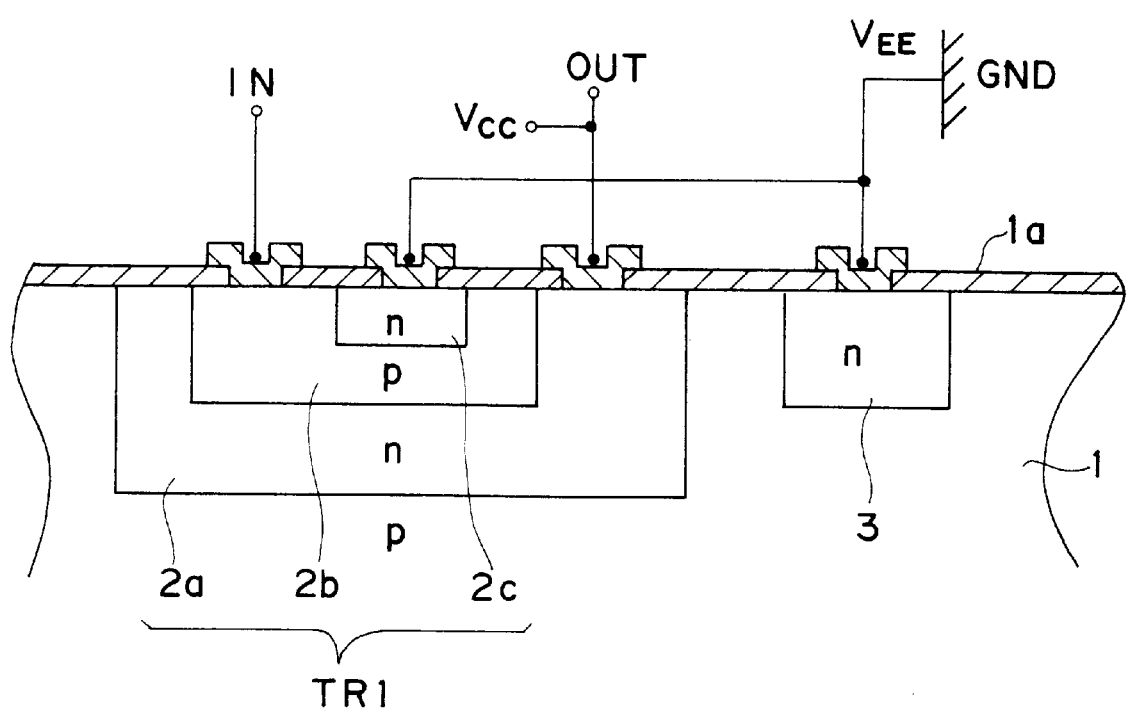
FIG. 3 is a schematic cross section of a semiconductor device provided with a planar bipolar transistor and a built-in ingredient acting as an element to protect the bipolar transistor from an external surge voltage e.g. an electrostatic surge voltage and the like, in accordance with a first embodiment of this invention.
Figure 4:
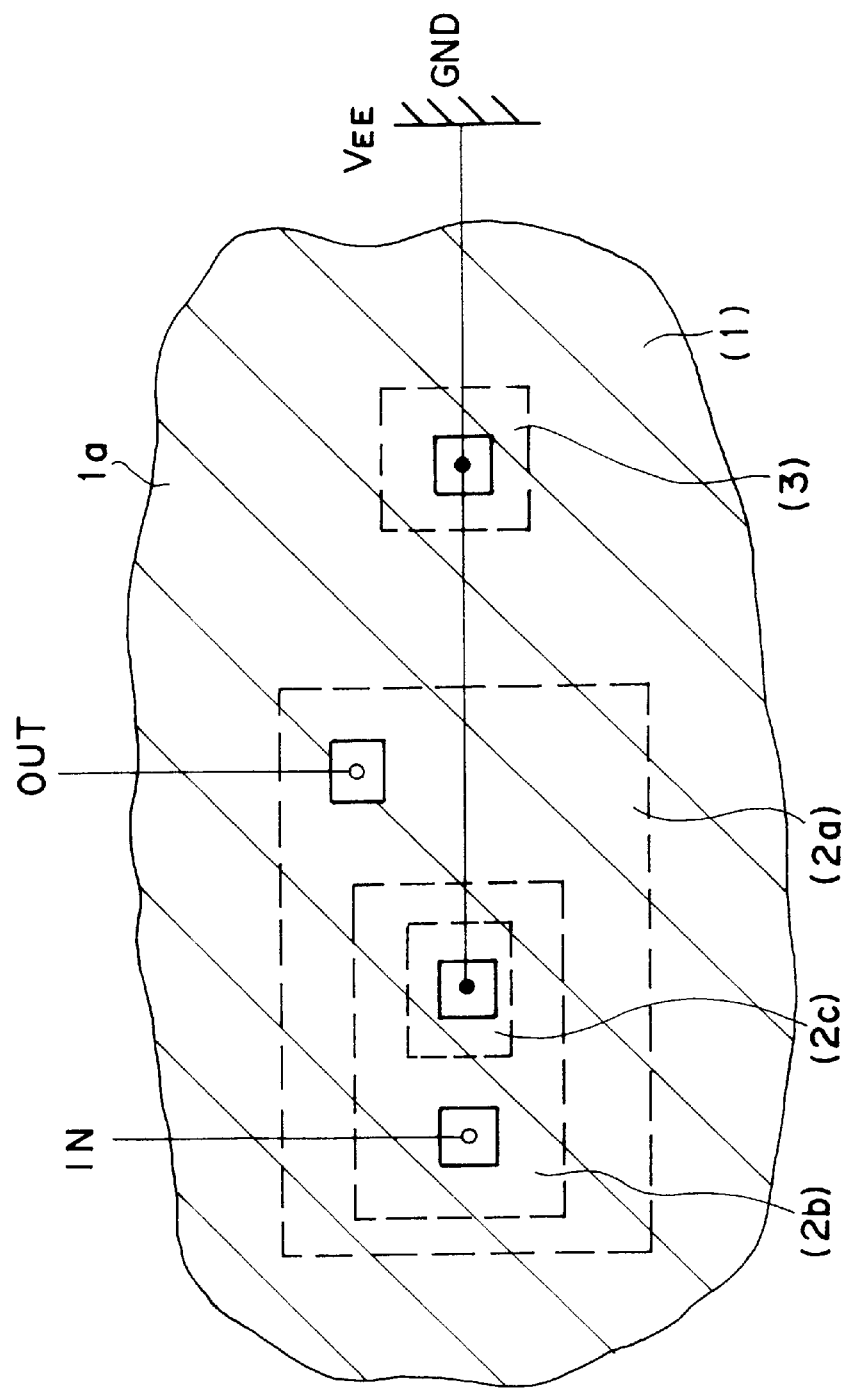
FIG. 4 is a schematic plan view of a semiconductor device provided with a planar bipolar transistor and a built-in ingredient acting as an element to protect the bipolar transistor from an external surge voltage e.g. an electrostatic surge voltage and the like, in accordance with a first embodiment of this invention.

Referring to FIGS. 3 and 4, the top surface of a p-doped Si substrate (1) is oxidized to produce an $SiO_2$ film (1a) thereon. After removing the $SiO_2$ film (1a) from an area on which a collector is scheduled to be produced, an n-impurity is introduced into the top surface region of the Si substrate (1) to produce a collector (2a). After an annealing process is conducted to diffuse the n-impurity, another $SiO_2$ film produced during the annealing process is removed from an area on which a base is scheduled to be produced. A p-impurity is introduced into the top surface region of the Si substrate (1) to produce a base (2b). After an annealing process is conducted to diffuse the p-impurity, another $SiO_2$ film produced during the annealing process and the original $SiO_2$ film (1a) are removed from areas on which an emitter and an n-doped region are scheduled to be produced. An n-impurity is introduced into the top surface region of the Si substrate (1) to produce an emitter (2c) and the n-doped region (3). An annealing process is conducted to diffuse the n-impurity. An etching process is conducted to produce contact holes on the collector (2a), the base (2b), the emitter (2c) and the n-doped region (3). After Al is deposited on the Si substrate (1), the Al film is patterned into the shape of electrodes of the collector (2a), the base (2b), the emitter (2c) and wirings which connect the collector (2a) with an output circuit (OUT), the base (2b) with an input circuit (IN), the emitter(2c) and the n-doped region (3) with a fixed potential ($V_{EE}$) or the ground potential.

Figure 5:
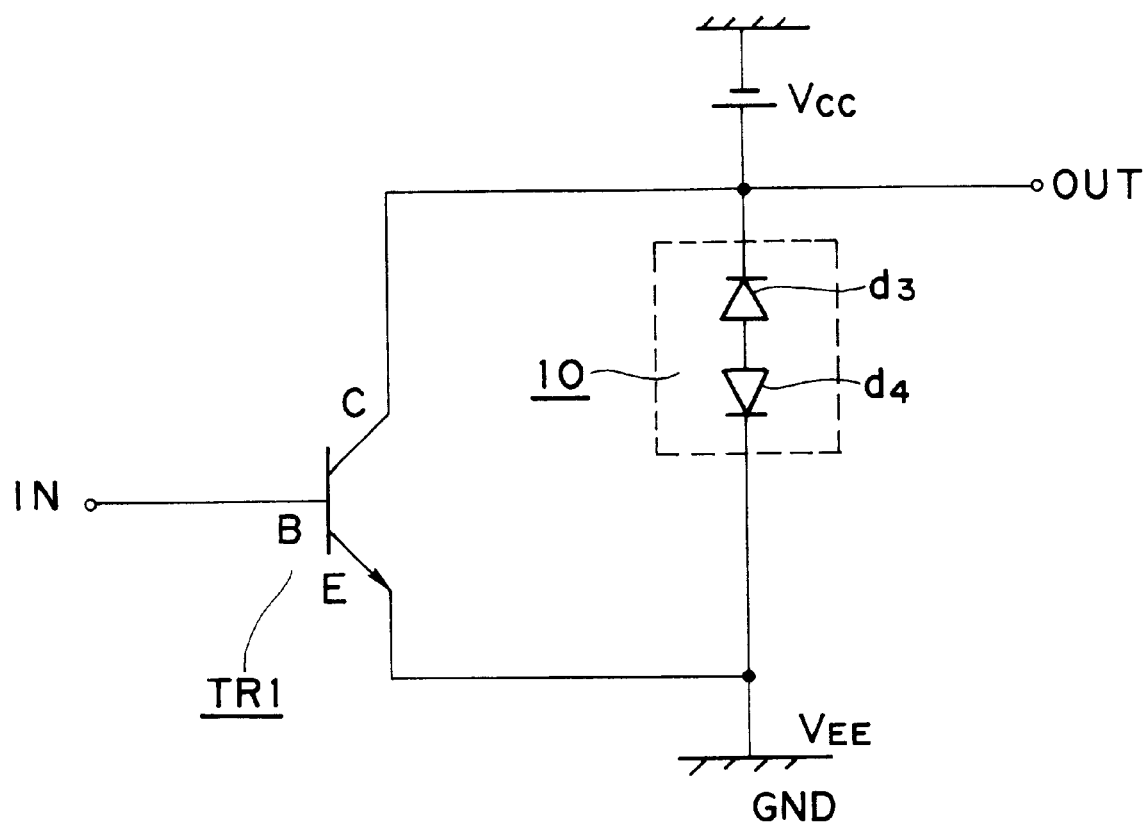
FIG. 5 is an equivalent circuit of a semiconductor device provided with a planar bipolar transistor and a built-in ingredient acting as an element to protect the bipolar transistor from an external surge voltage e.g. an electrostatic surge voltage and the like, in accordance with a first embodiment of this invention.

Referring to FIGS. 3, 4 and 5, since a p-n junction consisting of the n-doped layer (2a) and the p-Si substrate (1) and a p-n junction consisting of the p-Si substrate (1) and the n-doped region (3) are parasitic diodes ($d_3$) and ($d_4$), the collector (C) of the bipolar transistor (TR1) is connected with the fixed potential ($V_{EE}$) or the ground potential through a series circuit (10) of the diode ($d_3$) and ($d_4$) which are connected with each other in a backward direction. Although the diode ($d_4$) is connected with the collector (C) of the transistor (TR1) in the forward direction, the diode ($d_3$) is connected with the collector (C) of the transistor (TR1) in the backward direction.

Supposing an external positive surge voltage in excess of the positive we power supply voltage ($V_{CC}$) is applied to the collector (C), the diode ($d_3$) connected in the backward direction is broken down, and the external surge voltage is discharged into the fixed potential ($V_{EE}$) or to the ground through the diode ($d_4$) connected in the forward direction. In this manner, the external surge voltage bypasses the bipolar transistor (TR1), and the bipolar transistor (TR1) is protected from the external positive surge voltage.

Supposing an external negative surge voltage below the fixed potential ($V_{EE}$) is applied to the collector (C), the diode ($d_4$) connected in the forward direction is broken down and the external negative surge voltage is discharged into the fixed potential ($V_{EE}$) or to the ground through the diode ($d_3$) connected in the backward direction. In this manner, the external negative surge voltage bypasses the bipolar transistor (TR1) and the bipolar transistor (TR1) is protected from the external negative surge voltage.

Figure 6:
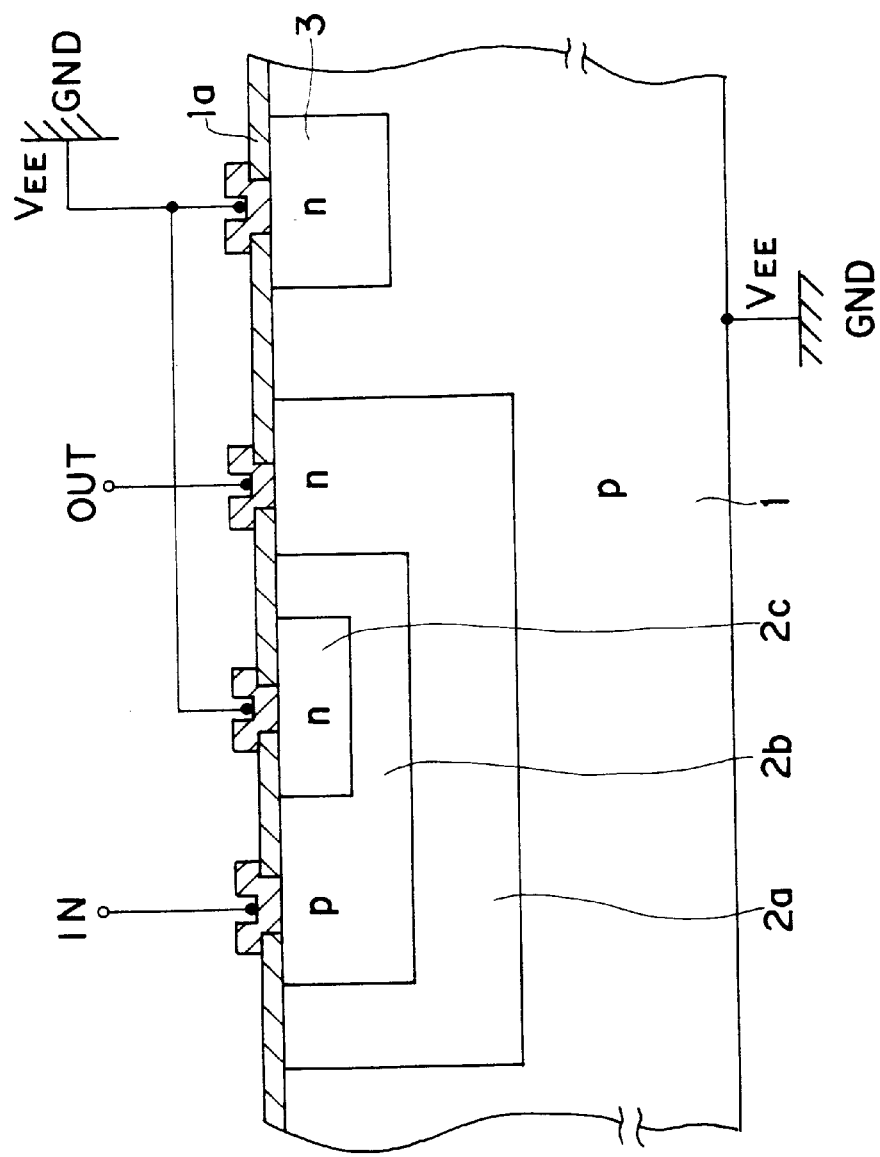
FIG. 6 is a schematic cross section of a semiconductor device provided with a planar bipolar transistor and a built-in ingredient acting as an element to protect the bipolar transistor from an external surge voltage e.g. an electrostatic surge voltage and the like, in accordance with a variation of the first embodiment of this invention.

Referring to FIG. 6, the Si substrate (1) can be connected with the fixed potential ($V_{EE}$) or the ground potential. In this case, an external positive surge voltage in excess of the positive power supply voltage ($V_{CC}$) causes an n-p junction between the collector (2a) and the p-doped Si substrate (1) or the diode ($d_3$) to be broken down to allow a current to flow into the fixed potential ($V_{EE}$) through the n-p junction between the collector (2a) and the p-doped Si substrate (1). This current causes the potential of the p-doped substrate (1) to increase due to the resistance thereof, resultantly readily causing the current flowing through p-n junction between the p-doped Si substrate (1) and the n-doped region (3) or the diode ($d_4$), to increase. As a result, an increase in temperature of the p-doped substrate (1) is effectively prohibited.

Figure 7:
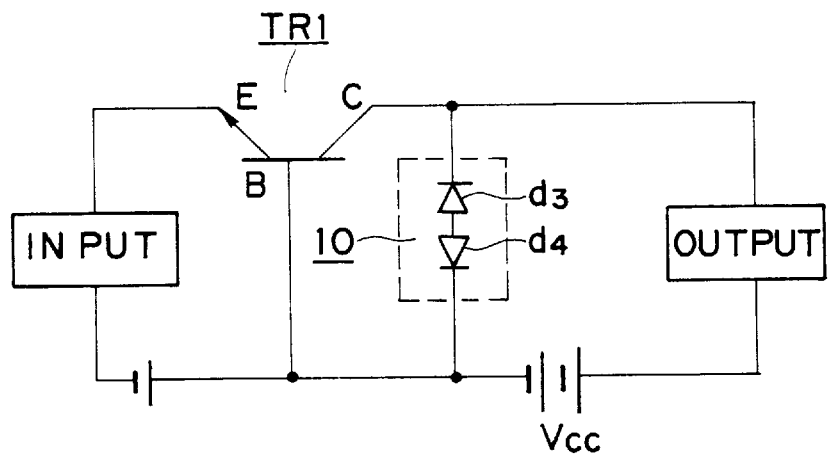
FIG. 7 is a circuit of a semiconductor device provided with a planar bipolar transistor and a built-in ingredient acting as an element to protect the bipolar transistor from an external surge voltage e.g. an electrostatic surge voltage and the like, in accordance with a first embodiment of this invention, the bipolar transistor being connected in a grounded base system.
Figure 8:
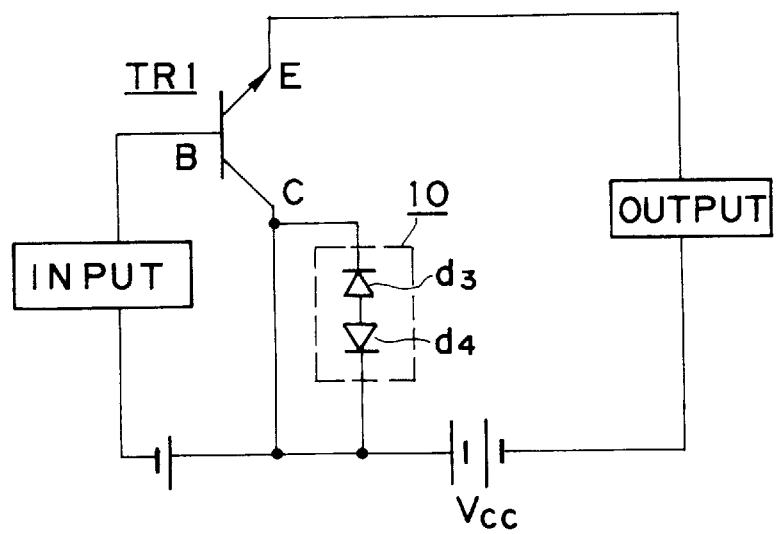
FIG. 8 is a circuit of a semiconductor device provided with a planar bipolar transistor and a built-in ingredient acting as an element to protect the bipolar transistor from an external surge voltage e.g. an electrostatic surge voltage and the like, in accordance with a first embodiment, of this invention, the bipolar transistor being connected in a grounded collector configuration or in an emitter follower configuration.

Although FIGS. 3, 4 and 5 illustrate a bipolar transistor (TR1) connected in a grounded emitter configuration, a grounded base configuration illustrated in FIG. 7 and a grounded collector configuration (or an emitter follower configuration) illustrated in FIG. 8 can be employed as well.

Although the foregoing description has been limited to an NPN transistor, a combination of a PNP transistor and a p-doped region can be employed as well.

In either case, the ingredient newly introduced to the semiconductor device provided with a planar bipolar transistor and a built-in ingredient acting as an element to protect the bipolar transistor from an external surge voltage e.g. an electrostatic surge voltage and the like, in accordance with this embodiment, is not connected with the collector of the planar bipolar transistor. Therefore, no parasitic capacitor which is connected with the collector of the planar bipolar transistor, is formed for the semiconductor device in accordance with this embodiment. As a result, there is no possibility in which this embodiment causes any adverse results to the operating speed of the planar bipolar transistor which is protected by the ingredient newly introduced by this embodiment.

Second Embodiment

A planar bipolar transistor surrounded by a doped region having a conductivity opposite to that of a semiconductor substrate.

Figure 9:
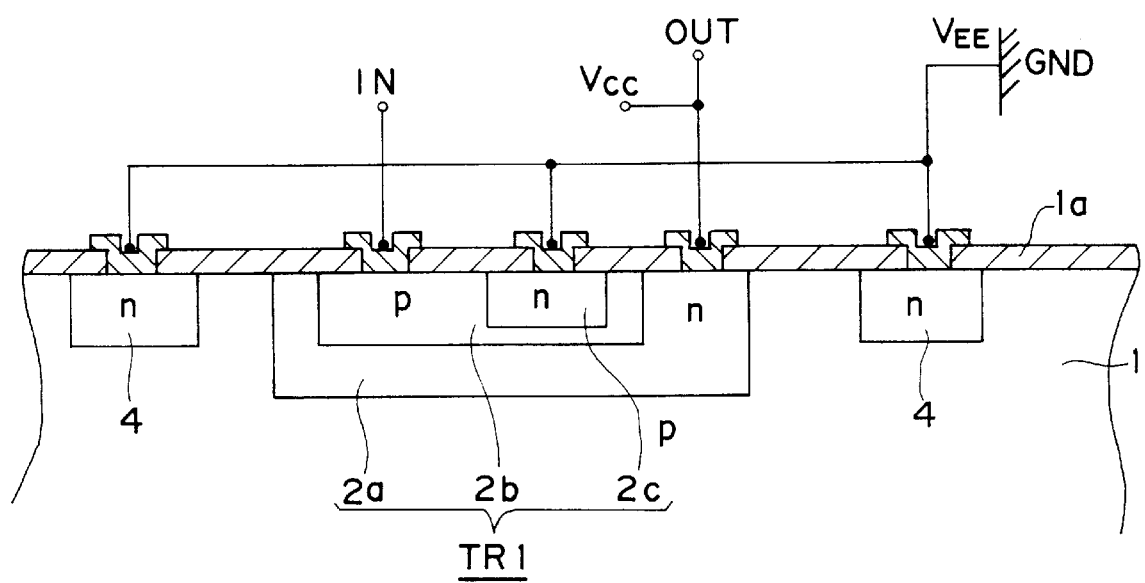
FIG. 9 is a schematic cross section of a semiconductor device provided with a planar bipolar transistor and a built-in ingredient acting as an element to protect the bipolar transistor from an external surge voltage e.g. an electrostatic surge voltage and the like, in accordance with a second embodiment of this invention.
Figure 10:
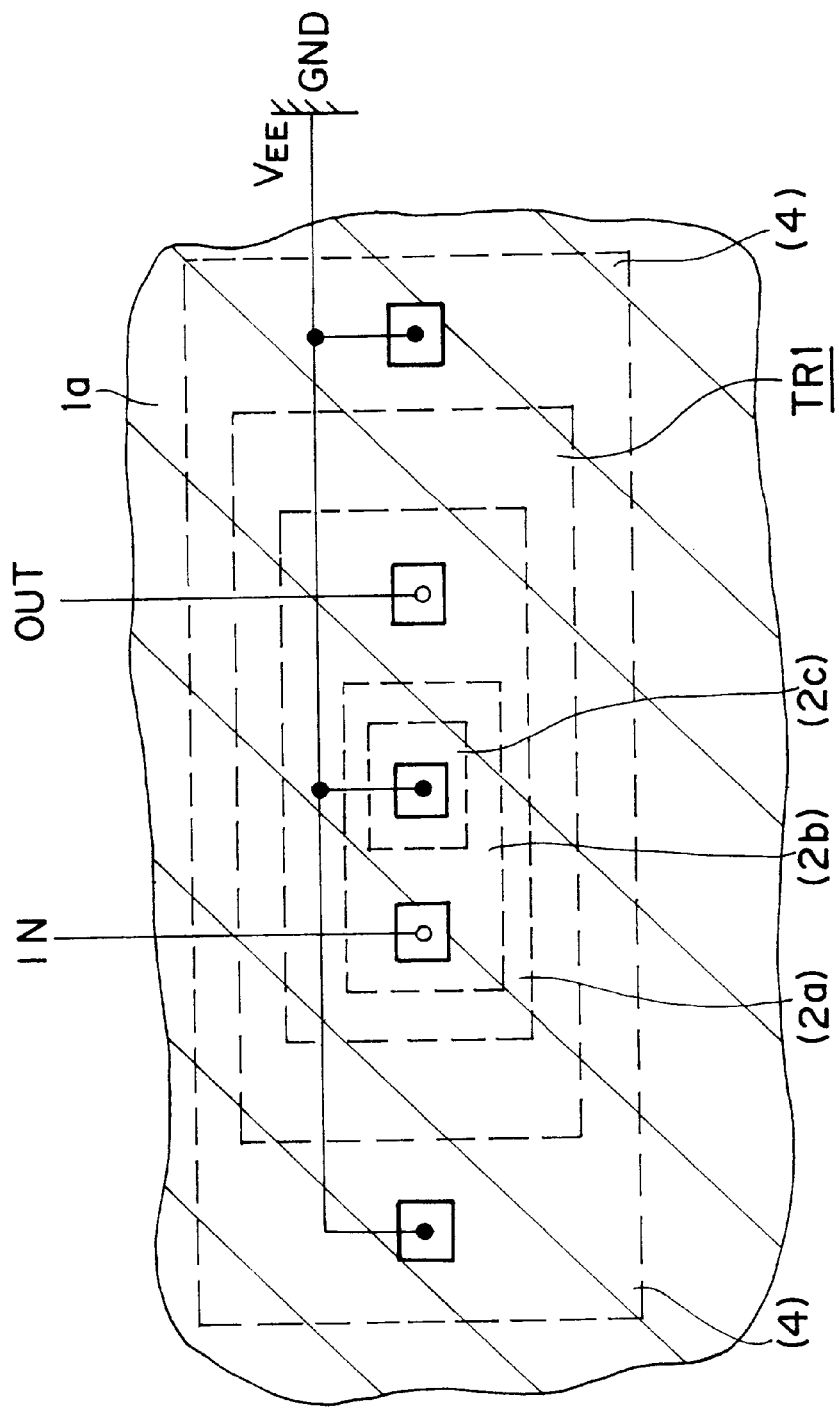
FIG. 10 is a schematic plan view of a semiconductor device provided with a planar bipolar transistor and a built-in ingredient acting as an element to protect the bipolar transistor from an external surge voltage e.g. an electrostatic surge voltage and the like, in accordance with a second embodiment of this invention.

Referring to FIGS. 9 and 10, a planar bipolar transistor (TR1) consisting of a collector (2a), a base (2b) and an emitter (2c) is surrounded by an n-doped region (4). As is illustrated in FIG. 3, an input signal (IN) is applied to the base (2b), and an output signal (OUT) is taken out of an output terminal (OUT) connected the collector (2a). The emitter (2c) is connected the fixed potential ($V_{EE}$) or is grounded. Incidentally, it is connected the n-doped region (4), which surrounds the transistor (TR1) in this embodiment.

The operation of the semiconductor device provided with a planar bipolar transistor and a built-in ingredient acting as an element to protect the bipolar transistor from an external surge voltage e.g. an electrostatic surge voltage and the like in accordance with this second embodiment of this invention is entirely identical to that of the semiconductor device provided with a planar bipolar transistor and a built-in ingredient acting as an element to protect the bipolar transistor from an external surge voltage e.g. an electrostatic surge voltage and the like in accordance with the first embodiment of this invention.

Supposing an external positive surge voltage in excess of the positive power supply voltage ($V_{CC}$) is applied to the collector (C), an n-p junction between the collector (2a) and the p-doped Si substrate (1) is broken down, and the external positive surge voltage is discharged into the fixed potential ($V_{EE}$) through the p-n junction between the p-doped Si substrate (1) and the n-doped region (4). In this manner, the external positive surge voltage bypasses the bipolar transistor (TR1), and the bipolar transistor (TR1) is protected from the external positive surge voltage.

Supposing an external negative surge voltage below the fixed potential ($V_{EE}$) is applied to the collector (C), a p-n junction between the p-doped Si substrate (1) and the n-doped region (4) is broken down, and the external negative surge voltage is discharged into the fixed potential ($V_{EE}$) through the n-p junction between the collector (2a) and the p-doped Si substrate (1). In this manner, the external negative surge voltage bypasses the bipolar transistor (TR1).

In this embodiment, the current caused by an external surge voltage is allowed to flow in a radial direction. As a result, a temperature rise in a limited area or a partial area is effectively avoided.

Although the foregoing description has been limited to an NPN transistor, a combination of a PNP transistor and a p-doped region can be employed as well.

In either case, the ingredient newly introduced to the semiconductor device provided with a planar bipolar transistor and a built-in ingredient acting as an element to protect the bipolar transistor from an external surge voltage e.g. an electrostatic surge voltage and the like, in accordance with this embodiment, is not connected the collector of the planar bipolar transistor. Therefore, no parasitic capacitor which is connected with the collector of the planar bipolar transistor is formed for the semiconductor device in accordance with this embodiment. As a result, there is no possibility in which this embodiment causes any adverse results to the operating speed of the planar bipolar transistor which is protected by the ingredient newly introduced by this embodiment.

Third Embodiment

A planar bipolar transistor attached by two doped regions each of which is doped with an impurity having a conductivity opposite to that of a semiconductor substrate, the emitter of the bipolar transistor being connected with the one of the doped regions located close to the bipolar transistor (TR1) and a fixed potential ($V_{EE}$) or the ground potential, the other one of the doped regions located remote from the bipolar transistor (TR1) being connected the positive power supply ($V_{CC}$).

Referring to FIGS. 11, 12 and 13, a planar bipolar transistor consisting of a collector (2a), a base (2b) and an emitter (2c) is attached by two doped regions (3) and (5) each of which is doped with an n impurity or an impurity having a conductivity opposite to that of a p-doped Si substrate (1). The emitter (2c) is connected the first one of the n-doped regions (3) located close to the bipolar transistor (TR1) and the fixed potential ($V_{EE}$) or the ground potential. The second one of the n-doped regions (5) located remote from the bipolar transistor (TR1) is connected with the positive power supply ($V_{CC}$).

The equivalent circuit of the semiconductor device is illustrated in FIG. 13.

The operation of the first one of the n-doped regions (3) is identical to that of the doped region (3) of the first embodiment of this invention.

Supposing an external positive surge voltage in excess of the positive power supply voltage ($V_{CC}$) is applied to the collector (C), an n-p junction between the collector (2a) and the p-doped substrate (1) or a diode ($d_3$) connected in the backward direction is broken down, and the external surge voltage is discharged into the fixed potential ($V_{EE}$) or to the ground through a p-n junction between the p-doped substrate (1) and the n-doped region (3) or a diode ($d_4$) connected in the forward direction. In this manner, the external surge voltage bypasses the bipolar transistor (TR1), and the bipolar transistor (TR1) is protected from the external positive surge voltage.

Supposing an external negative surge voltage below the fixed potential ($V_{EE}$) is applied to the collector (C), the p-n junction between the p-doped substrate (1) and the n-doped region (3) or a diode ($d_4$) connected in the forward direction is broken down and the external negative surge voltage is discharged into the fixed potential ($V_{EE}$) or to the ground through the n-p junction between the collector (2a) and the p-doped substrate (1) or the diode ($d_3$) connected in the backward direction. In this manner, the external negative surge voltage bypasses the bipolar transistor (TR1) and the bipolar transistor (TR1) is protected from the external negative surge voltage.

The operation of the second one (5) of the n-doped regions will be described below.

Supposing an external positive surge voltage in excess of the positive power supply voltage ($V_{CC}$) is applied to collector (C) and the diodes ($d_3$) and ($d_4$) are turned on, an n-p junction between the n-doped region (3) and the p-doped substrate (1) or a diode ($d_5$) and a p-n junction between the p-doped substrate (1) and an n-doped region (5) or a diode ($d_6$) are turned on as well to connect the collector (C) and the positive power supply ($V_{CC}$).

Supposing an external negative surge voltage below the fixed potential ($V_{EE}$) is applied to the collector (C) and the n-p junction between the collector (2a) and the p-doped substrate (1) or the diode ($d_3$) and the p-n junction between the p-doped substrate (1) and the n-doped region (3) or the diode ($d_4$) are turned on, the n-p junction between the n-doped region (3) and the p-doped substrate (1) or the diode ($d_5$) and the p-n junction between the p-doped substrate (1) and an n-doped region (5) or the diode ($d_6$) are turned on as well to connect the emitter (E) and the ($V_{CC}$).

Also in the case where the emitter (E) is disconnected the fixed potential ($V_{EE}$), the semiconductor device provided with a planar bipolar transistor and a built-in ingredient acting as an element to protect the bipolar transistor from an external surge voltage e.g. an electrostatic surge voltage and the like, in accordance with this embodiment, works in a similar manner as was described above.

In this manner, an external surge voltage applied to the collector (C) of the bipolar transistor (TR1) is driven away from the transistor (TR1).

Although the foregoing description has been limited to an NPN transistor, a combination of a PNP transistor and a p-doped region can be employed as well.

In either case, the ingredient newly introduced to the semiconductor device provided with a planar bipolar transistor and a built-in ingredient acting as an element to protect the bipolar transistor from an external surge voltage e.g. an electrostatic surge voltage and the like, in accordance with this embodiment, is not connected with the collector of the planar bipolar transistor. Therefore, no parasitic capacitor which is connected with the collector of the planar bipolar transistor is formed for the semiconductor device in accordance with this embodiment. As a result, there is no possibility in which this embodiment causes any adverse results to the operation speed of the planar bipolar transistor which is protected by the ingredient newly introduced by this embodiment.

Figure 14:
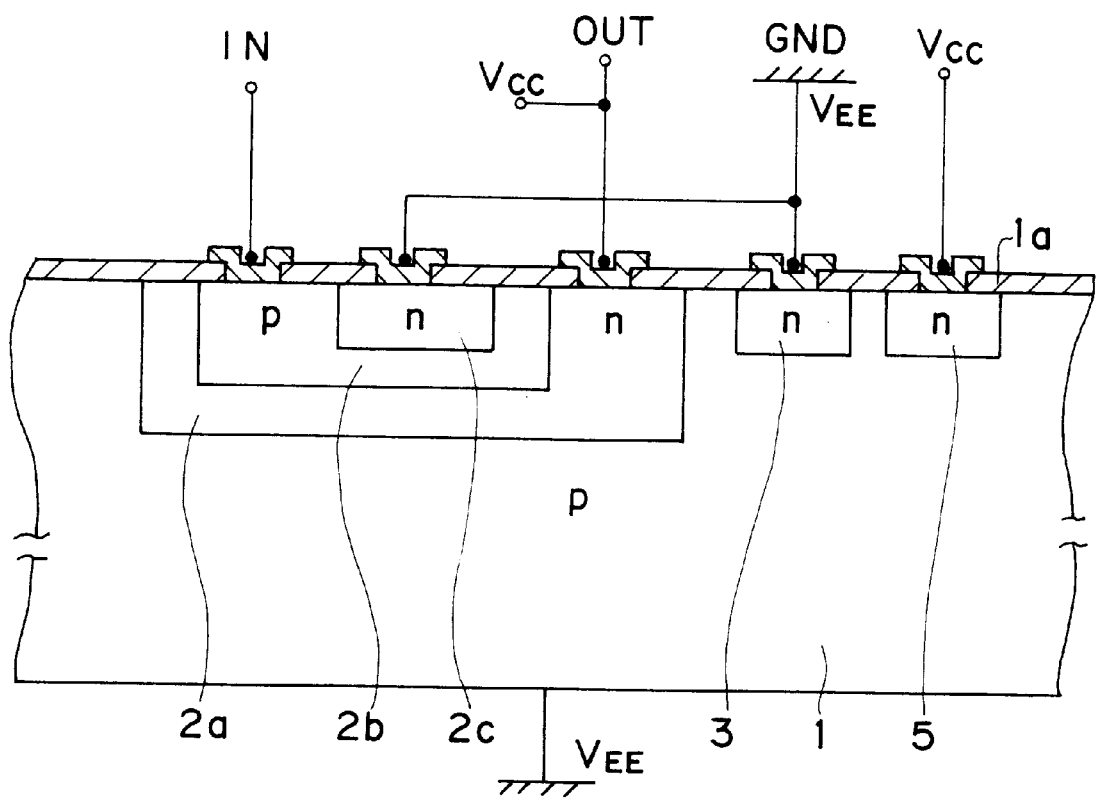
FIG. 14 is a schematic cross section of a semiconductor device provided with a planar bipolar transistor and a built-in ingredient acting as an element to protect the bipolar transistor from an external surge voltage e.g. an electrostatic surge voltage and the like, in accordance with a variation of the third embodiment of this invention.

Referring to FIG. 14, the Si substrate (1) can be connected with the fixed potential ($V_{EE}$) or the ground potential, as is in the case of the first embodiment, for the purpose to realize the same results realized in the first embodiment. In other words, an increase in temperature of the p-doped Si substrate (1) is effectively prohibited.

Fourth Embodiment

A planar bipolar transistor surrounded by two doped regions having a conductivity opposite to that of a semiconductor substrate.

Referring to FIGS. 15 and 16, a planar bipolar transistor (TR1) consisting of a collector (2a), a base (2b) and an emitter (2c) is surrounded by two n-doped regions (3) and (5) having the conductivity opposite to that of the p-doped Si substrate. An input signal (IN) is applied to the base (2b), and an output signal (OUT) is taken out of an output terminal (OUT). The emitter (2c) is connected the first one of the doped regions (3) located close to the bipolar transistor (TR1) and the fixed potential ($V_{EE}$) or the ground potential. The second one of the doped regions (5) located remote from the bipolar transistor (TR1) is connected with the positive power supply ($V_{CC}$).

The operation of the semiconductor device in accordance with the fourth embodiment of this invention is entirely identical to that of the semiconductor device in accordance with the third embodiment of this invention.

Although the foregoing description has been limited to an NPN transistor, a combination of a PNP transistor and a p-doped region can be employed as well.

In either case, the ingredient newly introduced to a semiconductor device provided with a planar bipolar transistor and a built-in ingredient acting as an element to protect the bipolar transistor from an external surge voltage e.g. an electrostatic surge voltage and the like, in accordance with this embodiment, is not connected the collector (C) of the planar bipolar transistor (TR1). Therefore, no parasitic capacitor which is connected the collector (C) of the planar bipolar transistor (TR1), is drove from this invention. As a result, there is no possibility in which this invention causes any adverse results to the operating speed of the planar bipolar transistor which is protected by the ingredient newly introduced by this invention.

Figure 17:
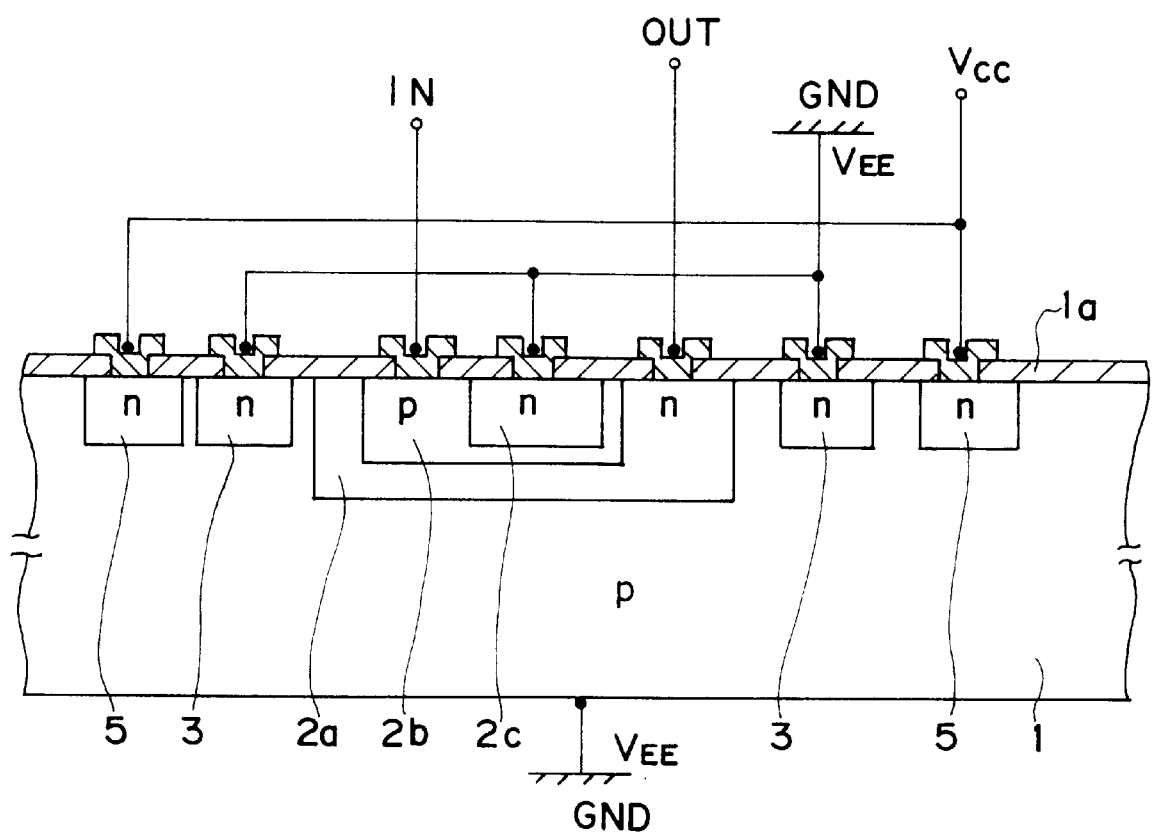
FIG. 17 is a schematic cross section of a semiconductor device provided with a planar bipolar transistor and a built-in ingredient acting as an element to protect the bipolar transistor from an external surge voltage e.g. an electrostatic surge voltage and the like, in accordance with a variation of the fourth embodiment of this invention.

Referring to FIG. 17, the p-doped Si substrate (1) can be connected with the fixed potential ($V_{EE}$) or the ground potential, as is in the case of the first embodiment, for the purpose to realize the same results realized in the first embodiment (See FIG. 6.). In other words, an increase in temperature of the p-doped Si substrate (1) is effectively prohibited.

Figure 18:
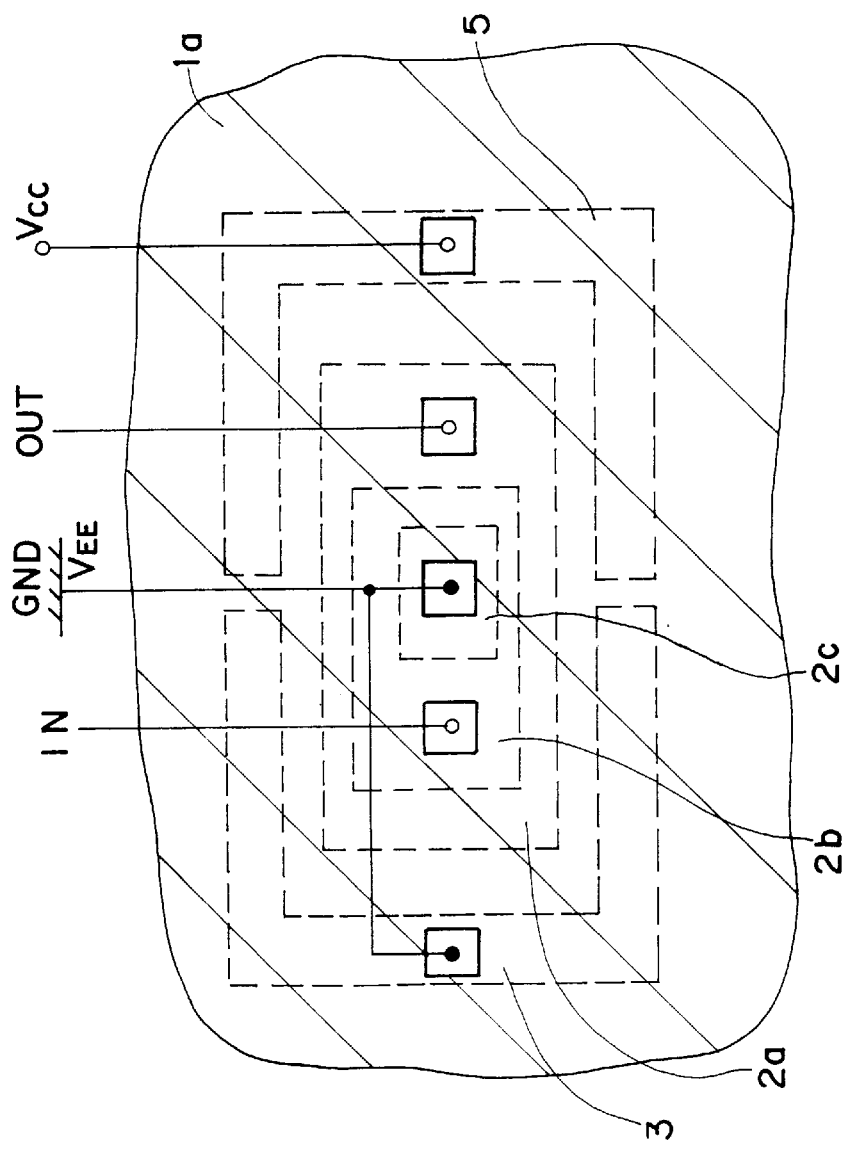
FIG. 18 is a schematic plan view of a semiconductor device provided with a planar bipolar transistor and a built-in ingredient acting as an element to protect the bipolar transistor from an external surge voltage e.g. an electrostatic surge voltage and the like, in accordance with another variation of the fourth embodiment of this invention.

Referring to FIG. 18, the left half of the planar bipolar transistor (TR1) is surrounded by the first doped region (3) and the right half of the planar bipolar transistor (TR1) is surrounded by the second doped region (5). The diodes (d3) and (d4) exist between the facing edges of the first doped region (3) and the second doped region (5).

Figure 19:
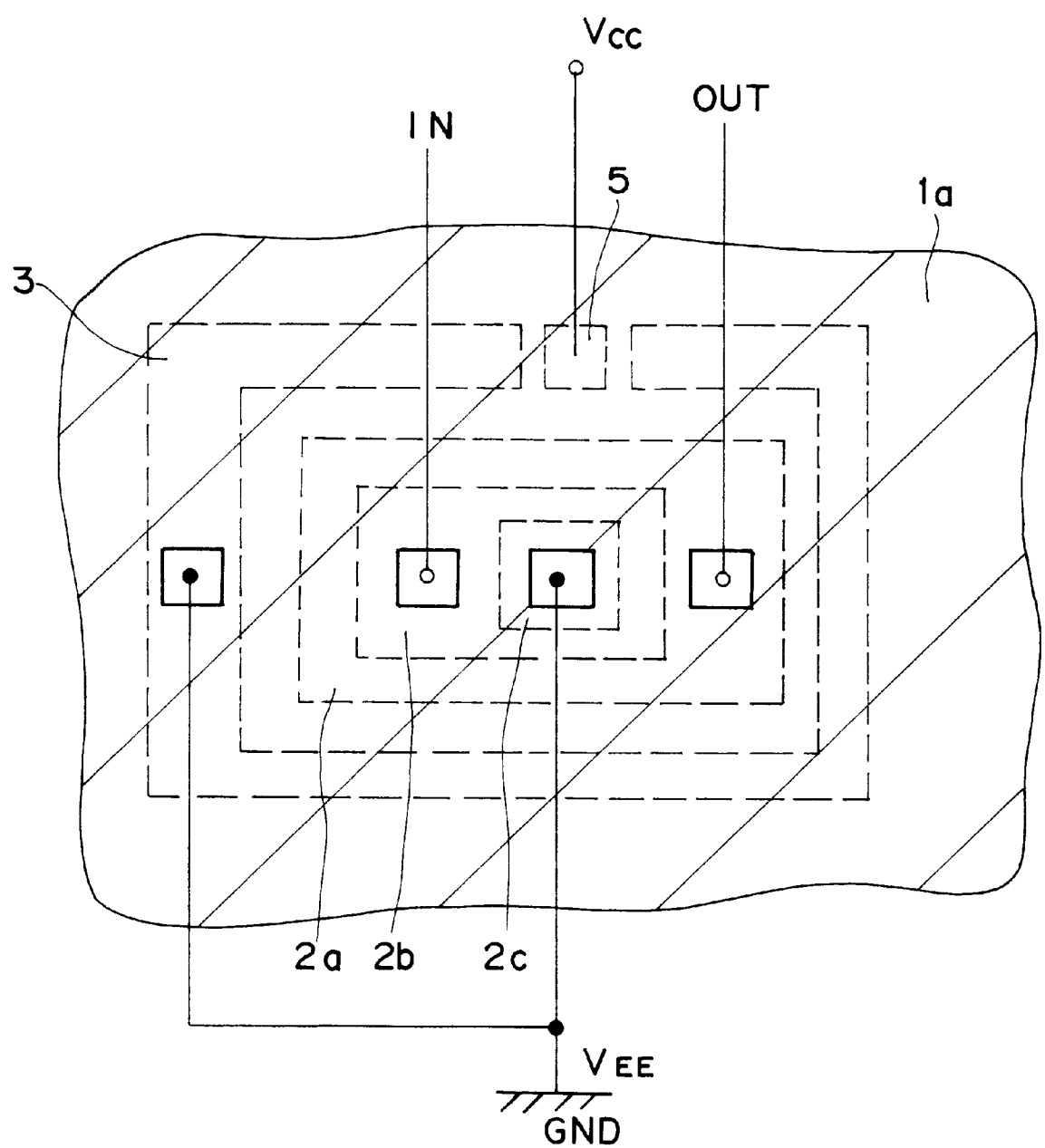
FIG. 19 is a schematic plan view of a semiconductor device provided with a planar bipolar transistor and a built-in ingredient acting as an element to protect the bipolar transistor from an external surge voltage e.g. an electrostatic surge voltage and the like, in accordance with yet another variation of the fourth embodiment of this invention.

Referring to FIG. 19, part of the planar bipolar transistor (TR1) is surrounded by the first doped region (3) and a remaining limited part of the planar bipolar transistor (TR1) is surrounded by the second doped region (5).

The foregoing description has clarified that this invention has successfully provided a semiconductor device provided with a planar bipolar transistor and a built-in ingredient acting as an element to protect the bipolar transistor from an external surge voltage e.g. an electrostatic surge voltage and the like, wherein no parasitic capacitors are formed to be connected the collector of the planar bipolar transistor, whereby the operation speed of a circuit including the transistor is not reduced by potential parasitic capacitors which otherwise accompany the built-in ingredients produced to protect the transistor from an external surge voltage e.g. an electrostatic surge voltage and the like.

Although this invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A semiconductor device comprising:
   a semiconductor substrate comprising a p-conductivity type region;
   an NPN bipolar transistor disposed along a surface of said semiconductor substrate, said NPN bipolar transistor disposed in said p-conductivity type region; and
   an n-conductivity type region disposed along the surface of said semiconductor substrate at a location spaced apart from and proximate an outer periphery of said bipolar transistor, said n-conductivity type region disposed in said p-conductivity type region, wherein an emitter of said bipolar transistor is electrically connected with said n-conductivity type region and with a fixed potential or a ground potential, and wherein an external surge voltage applied to a collector of said bipolar transistor is driven away to the fixed potential or the ground potential via said substrate and said n-conductivity type region, protecting said bipolar transistor from said external surge voltage.

2. A semiconductor device in accordance with claim 1, wherein said semiconductor substrate is connected with a fixed potential.

3. A semiconductor device in accordance with claim 1 or 2, wherein said bipolar transistor is surrounded by said n-doped region.

4. A semiconductor device in accordance with claim 1 or 2, further comprising a second n-doped region disposed along the top surface of said semiconductor substrate at a location close to said n-doped region, wherein said second n-doped region is connected with a positive potential.

5. A semiconductor device in accordance with claim 4, wherein a first half part of said bipolar transistor is surrounded by said n-doped region and a remaining half part of said bipolar transistor is surrounded by said second n-doped region.

6. A semiconductor device in accordance with claim 4, wherein a majority portion of said bipolar transistor is surrounded by said n-doped region and a remaining minority portion of said bipolar transistor is surrounded by said second n-doped region.

7. A semiconductor device, in accordance with claim 4, wherein said second n-doped region surrounds said first n-doped region.

8. A semiconductor device comprising:
   a semiconductor substrate comprising an n-conductivity type region;
   a PNP bipolar transistor disposed along a surface of said semiconductor substrate, said PNP bipolar transistor disposed in said n-conductivity type region; and
   a p-conductivity type region disposed along the surface of said semiconductor substrate at a location spaced apart from and proximate an outer periphery of said bipolar transistor, said p-conductivity type region disposed in said n-conductivity type region, wherein an emitter of said bipolar transistor is electrically connected with said p-conductivity type region and with a fixed potential or a ground potential, and wherein an external surge voltage applied to a collector of said bipolar transistor is driven away to the fixed potential or the ground potential via said substrate and said p-conductivity type region, protecting said bipolar transistor from said external surge voltage.

9. A semiconductor device in accordance with claim 8, wherein said semiconductor substrate is connected with a fixed potential or the ground potential.

10. A semiconductor device in accordance with claim 8 or 9, wherein said bipolar transistor is surrounded by said p-doped region.

11. A semiconductor device in accordance with claim 8 or 9, further comprising a second p-doped region disposed along the top surface of said semiconductor substrate at a location close to said p-doped region, wherein said second p-doped region is connected with a positive potential.

12. A semiconductor device in accordance with claim 11, wherein a first half part of said bipolar transistor is surrounded by said p-doped region and a remaining half part of said bipolar transistor is surrounded by said second p-doped region.

13. A semiconductor device, in accordance with claim 12, wherein said second p-doped region surrounds said first p-doped region.

14. A semiconductor device in accordance with claim 11, wherein a majority portion of said bipolar transistor is surrounded by said first p-doped region and a remaining minority portion of said bipolar transistor is surrounded by said second p-doped region.

15. A semiconductor device comprising:
   a semiconductor substrate of a first conductivity;
   a bipolar transistor disposed along a surface of said semiconductor substrate, said transistor having an outer periphery generally in the shape of a rectangle;
   a first region of a second conductivity, disposed along the surface of said semiconductor substrate and spaced apart from and extending partially around said outer periphery of said transistor such that an inner side of said first region faces toward at least a portion of each three sides of said rectangle, wherein said first region is electrically connected with an emitter of said bipolar transistor and with a fixed potential or a ground potential; and
   a second region of said second conductivity, disposed along the surface of said semiconductor substrate and spaced apart from and extending partially around said outer periphery of said transistor such that an inner side of said second region faces toward at least a portion of each of three sides of said rectangle, wherein said second region is electrically connected with a positive potential.

16. A semiconductor device in accordance with claim 15, wherein said first conductivity is n-type, said second conductivity is p-type, and said bipolar transistor is a PNP bipolar transistor.

17. A semiconductor device in accordance with claim 15, wherein said first conductivity is p-type, said second conductivity is n-type, and said bipolar transistor is an NPN bipolar transistor.

* * * * *